United States Patent
Sivaswamy et al.

(10) Patent No.: US 10,318,699 B1
(45) Date of Patent: Jun. 11, 2019

(54) FIXING HOLD TIME VIOLATIONS USING HOLD TIME BUDGETS AND SLACKS OF SETUP TIMES

(71) Applicant: Xilinx, Inc., San Jose, CA (US)

(72) Inventors: Satish B. Sivaswamy, Fremont, CA (US); Parivallal Kannan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/621,913

(22) Filed: Jun. 13, 2017

(51) Int. Cl.
*G06F 17/50* (2006.01)

(52) U.S. Cl.
CPC ...... *G06F 17/5081* (2013.01); *G06F 17/5031* (2013.01); *G06F 17/5036* (2013.01); *G06F 17/5077* (2013.01)

(58) Field of Classification Search
CPC ............. G06F 17/5081; G06F 17/5031; G06F 17/5077
See application file for complete search history.

(56) References Cited

U.S. PATENT DOCUMENTS

| | | | |
|---|---|---|---|
| 6,167,001 A | 12/2000 | Wu | |
| 6,934,922 B1 | 8/2005 | Burnley | |
| 6,938,236 B1 * | 8/2005 | Park | G06F 17/5045 716/103 |
| 7,254,794 B1 | 8/2007 | Burnley | |
| 7,312,631 B1 | 12/2007 | Bauer et al. | |
| 7,472,365 B1 | 12/2008 | Manaker, Jr. | |
| 7,475,297 B1 | 1/2009 | Manaker, Jr. | |
| 7,548,089 B1 | 6/2009 | Bauer et al. | |
| 2009/0007041 A1 * | 1/2009 | Miyagawa | G06F 17/5031 716/113 |
| 2015/0248520 A1 * | 9/2015 | Dai | G06F 17/5081 716/114 |

OTHER PUBLICATIONS

Fung et al., "Slack Allocation and Routing to Improve FPGA timing While Repairing Short-Path Violations"; pp. 1-13, Mar. 28, 2007, IEEE Transactions on Computer-Aided Design of Integrated circuits and Systems, vol. 27, Issue 4.

Kannan, P., et al., "Performance driven Routing for Modem FPGAs Invited Paper", 6 pages, ICCAD' 16, Nov. 7-10, 2016, Austin, TX, USA.

(Continued)

*Primary Examiner* — Vuthe Siek
(74) *Attorney, Agent, or Firm* — LeRoy D. Maunu

(57) ABSTRACT

Disclosed approaches for fixing a hold time violation in a circuit design include determining a first hold budget that is an amount to fix a first hold time violation on a first path of the circuit design. For each connection of a first plurality of connections on the first path, a respective projected setup slack of the connection in allocating the first hold budget to fixing the first hold time violation on the connection is determined. For each connection of the first plurality of connections, a respective connection hold budget based on the first hold budget and the respective projected setup slack is determined. Each connection of the first plurality of connections is adjusted according to the respective connection hold budget.

20 Claims, 4 Drawing Sheets

(56) References Cited

OTHER PUBLICATIONS

VLSI Concepts, 10 Ways to fix Setup and Hold violation: Static Timing Analysis (STA) Basic (Part-8), http://www.vlsi-expert.com/2014/01/10-ways-to-fix-setup-and-hold-violation.html, Jan. 10, 2014, 6 pages.
Xilinx, Inc., "ISE Design Suite 14: Release Notes, Installation, and Licensing"; UG631, v14.7, Oct. 2, 2013, 74 pages, San Jose, CA USA.
Youssef, H. et al., "Timing Constraints for Correct Performance", IEEE, 1990, pp. 24-27.

* cited by examiner

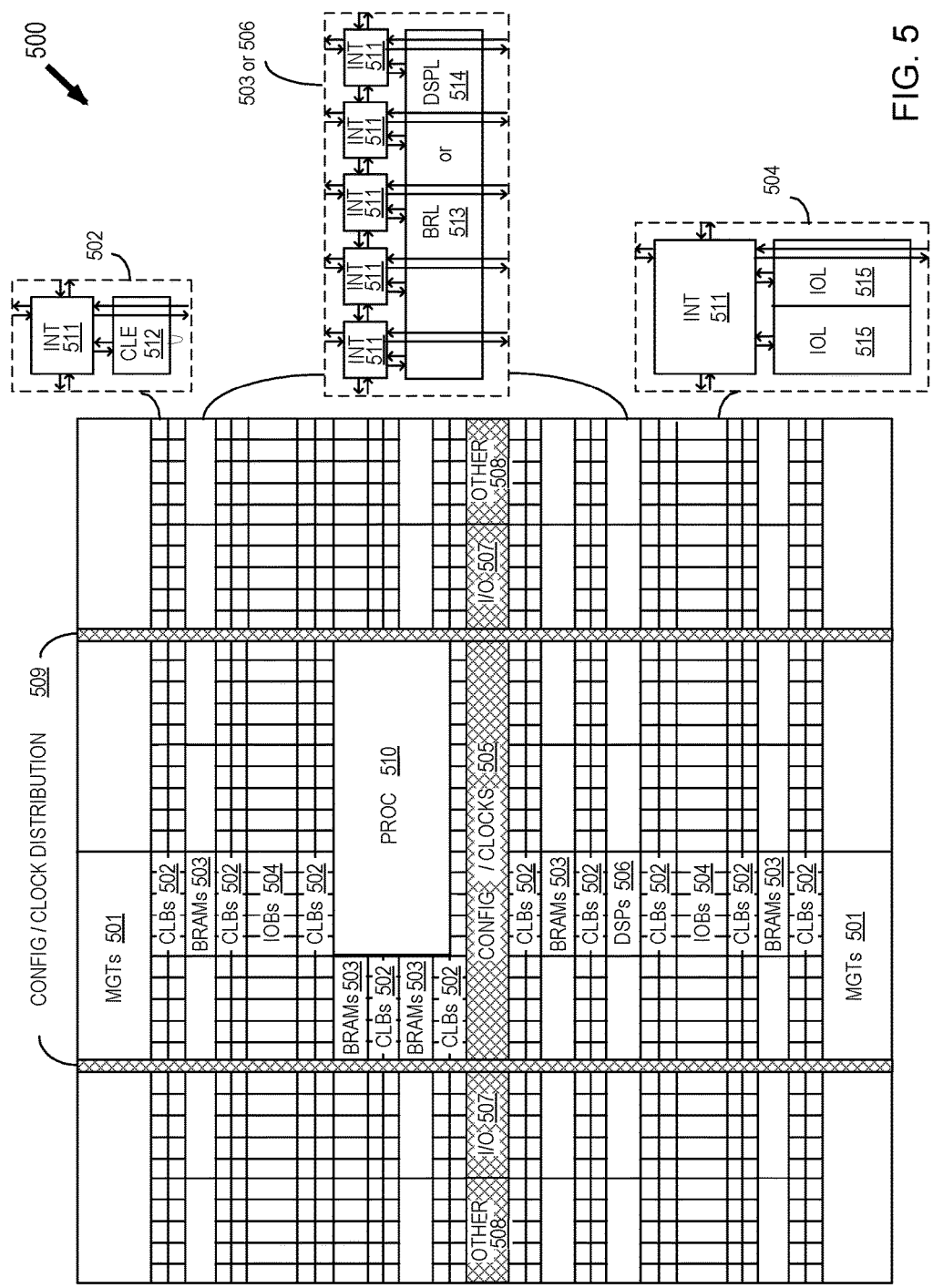

US 10,318,699 B1

FIXING HOLD TIME VIOLATIONS USING HOLD TIME BUDGETS AND SLACKS OF SETUP TIMES

TECHNICAL FIELD

The disclosure generally relates to fixing hold time violations in circuit designs.

BACKGROUND

Digital electronic logic devices, such as microprocessors, field-programmable gate arrays ("FPGAs"), complex logic devices ("CPLDs"), and application-specific integrated circuits ("ASICs") use a digital clock signal to synchronize operations of different portions of the logic device. Generally, the digital clock signal enables logic and memory cells to read and write data at the appropriate times.

"Setup time" and "hold time" describe the timing requirements on the data input of a sequential logic element, such as a flip-flop or register, with respect to a clock input. The set-up and hold times define a window of time during which data must be stable to guarantee predictable performance over a full range of operating conditions and manufacturing tolerances. The setup time is the minimum amount of time that an input data signal must be held steady before a clock event, such as a rising or falling edge of a clock signal, in order for the state of the data signal to be reliably captured. Hold time is the minimum amount of time the input data signal should be held steady after the clock event in order for the state of the data signal to be reliably captured. A setup time violation, which is sometimes referred to as a long path problem, can be remedied by reducing the path length or reducing the clock speed. A hold time violation, which is sometimes referred to as a short path problem, can be remedied by increasing the path length or adding delay circuitry to the signal path.

Timing analysis performed during place-and-route CAD processes identifies and attempts to remedy timing violations in a circuit design. However, current approaches require significant computing resources and may produce unsatisfactory results.

SUMMARY

A disclosed method of fixing a hold time violation in a circuit design includes performing operations on a computing arrangement. The operations include determining a first hold budget that is an amount to fix a first hold time violation on a first path of the circuit design, and determining for each connection of a first plurality of connections on the first path, a respective projected setup slack of the connection in allocating the first hold budget to fixing the first hold time violation on the connection. The operations further include determining for each connection of the first plurality of connections, a respective connection hold budget based on the first hold budget and the respective projected setup slack. Each connection of the first plurality of connections is adjusted in performing the operations according to the respective connection hold budget.

A disclosed system includes one or more processors and a memory arrangement coupled to the one or more processors. The memory arrangement is configured with instructions for fixing a hold time violation in a circuit design, and the instructions when executed by the one or more processors cause the one or more processors to perform a number of operations. The operations include determining a first hold budget that is an amount to fix a first hold time violation on a first path of the circuit design and determining for each connection of a first plurality of connections on the first path, a respective projected setup slack of the connection in allocating the first hold budget to fixing the first hold time violation on the connection. The operations further include determining for each connection of the first plurality of connections, a respective connection hold budget based on the first hold budget and the respective projected setup slack. Each connection of the first plurality of connections is adjusted in performing the operations according to the respective connection hold budget.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 5 shows a programmable integrated circuit on which the disclosed circuits and processes may be implemented.

DETAILED DESCRIPTION

Figure 1:
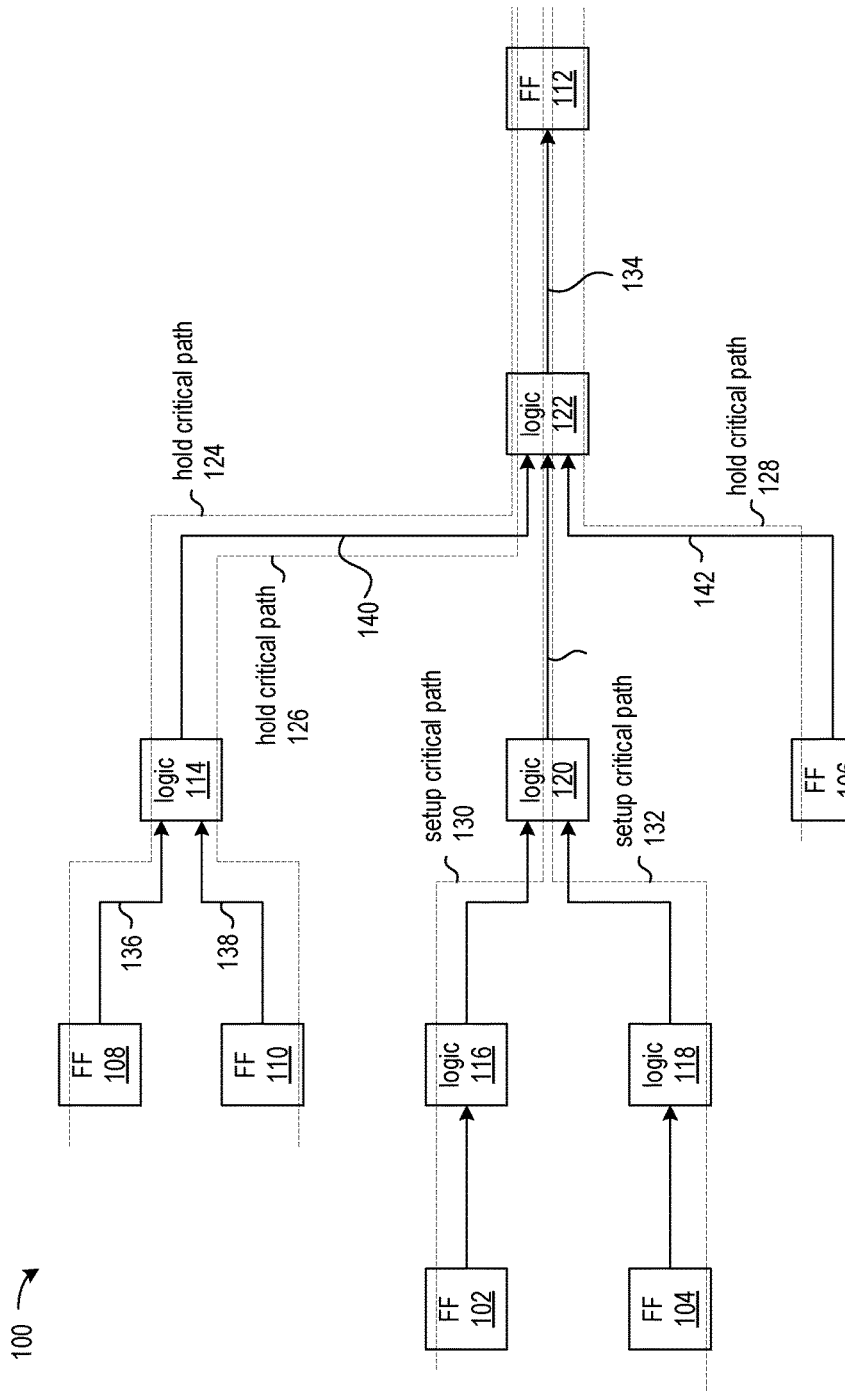
FIG. 1 shows an exemplary circuit 100 to which the disclosed approaches may be applied to fix hold time violations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

FIG. 1 shows an exemplary circuit 100 to which the disclosed approaches may be applied to fix hold time violations. The circuit illustrates the problem of how fixing hold-time violations could degrade circuit timing. In attempting to remedy all or part of a hold violation on one connection, conventional approaches can exacerbate a setup violation on a path having the same connection.

The circuit 100 shows the fan-in cone to flip-flop 112. Signals from flip-flops 102, 104, 106, 108, 110, and 112 are input signals to logic circuits 114, 116, 118, 120, and 122. The circuit 100 has three hold critical paths and two setup critical paths. The hold critical paths are circuit paths on which there are hold time violations and include the path 124 from flip-flop 108 to flip-flop 112 through logic circuits 114 and 122; the path 126 from flip-flop 110 to flip-flop 112 through logic circuits 114 and 122; and path 128 from flip-flop 106 to flip-flop 112 through logic circuit 122. The two setup critical paths are circuit paths on which there are setup time violations and include the path 130 from flip-flop 102 to flip-flop 112 through logic circuits 116, 120, and 122; and the path 132 from flip-flop 104 to flip-flop 112 through logic circuits 118, 120, and 122.

The hold critical paths 124, 126, and 128 and the setup critical paths 130 and 132 share the connection 134 between the logic circuit 122 and the flip-flop 112. Thus, fixing the hold violations on hold critical paths 124, 126, and 128 by adding delay to connection 134 would worsen the setup violations on setup critical paths 130 and 132. Similarly, in a scenario in which paths 130 and 132 did not have setup violations, fixing the hold violations by adding delay to connection 134 might create a setup violation. Alternatively, fixing the hold violations by adding delays to connections 136, 138, 140, or 142 would avoid adversely affecting the paths 130 and 132. The disclosed approaches, in allocating hold budgets to connections for fixing hold violations, account for the impact on setup times.

Figure 2:
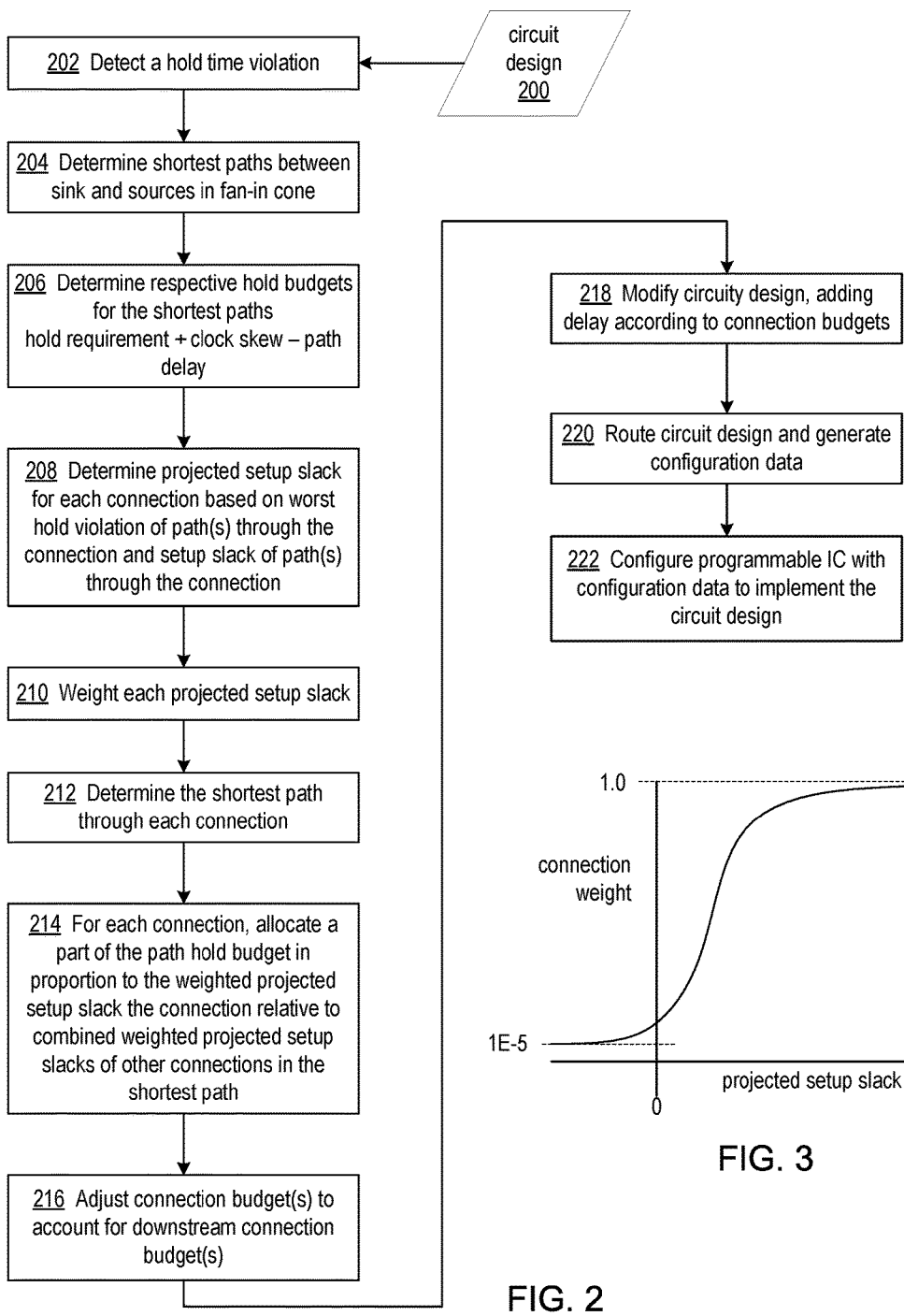
FIG. 2 shows a flowchart of a process of budgeting time to connections for fixing a hold time violation in a path.

FIG. 2 shows a flowchart of a process of budgeting time to connections for fixing a hold time violation in a path. The process can be performed by a computing arrangement specifically programmed with an electronic design automation (EDA) tool. The computing arrangement inputs circuit design 200 and detects a hold time violation at block 202, such as by performing static timing analysis on the circuit design.

For a path determined to have a hold violation, at block 204 the process determines the shortest paths between the sink of the path and the sources in the fan-in cone of the sink. In general, the shortest path from a source to a sink is the path having the fewest number of connections from the source to the sink. For example, with reference to FIG. 1, the sink is flip-flop 112, and the fan-in cone includes the paths from source flip-flips 102, 104, 106, 108, and 110 to sink flip-flop 112. Though not shown in the exemplary circuit 100, a signal may fan-out from a logic gate, and the signal path may converge with another signal path(s) in the fan-in cone to the sink. For example, in an exemplary circuit different from circuit 100, the signal from logic circuit 114 could fan-out to one or more additional logic circuits, and the output signal from one of those logic circuits could be another input to the logic circuit 122. The shortest path between flip-flop 108 and flip-flop 112 would be the path that includes connections 136, and 140.

At block 206, the process determines the amount of delay needed to fix the hold time violation on the path. The amount of delay can be referred to as the "total hold budget" for the path. The total hold budget for a path can be computed as:

total hold budget=hold requirement+clock skew−path delay

The total hold budget will be a positive value for a path having a hold time violation as the path delay is too small to cause the signal to arrive at the desired time. It will be recognized that values of the hold requirement, clock skew, and path delay are particular to each circuit design. The total hold budget is divided amongst the connections on the path according to the algorithm that follows.

At block 208, the process determines a projected setup slack for each connection in the fan-in cone. The projected setup slack for a connection quantifies the effect on the setup time through the connection if all of the total hold violation were to be fixed on the connection. The projected setup slack helps in considering the impact on setup while determining how much of the hold violation should be fixed on a connection. Connections having high projected setup slacks are assigned high weights, and connections having low projected setup slacks are assigned low weights. Weighting the projected setup slacks forces assignment of smaller connection hold budgets to connections that are on both setup critical (or having a small setup slack) and hold critical paths, and assignment of larger connection hold budgets to connections that have sufficient setup slack.

The projected setup slack for connection i ($PSS_i$) is:

$$PSS_i = S_i - \text{hold budget} * (\text{slow corner delay/fast corner delay})$$

$S_i$ is the setup slack of the path having the least slack and including connection i. For example, in FIG. 1 connection 134 is on the hold critical paths 124, 126, and 128 and the setup critical paths 130 and 132. Setup critical paths 130 and 132 can have different setup slack values. In computing the PSS for connection 134, the value for S is the least of the setup slack values of setup critical paths 130 and 132. $S_i$ will be a very large value for connection i that is not part of a setup critical path and will be negative for a path having a setup time violation. The slow corner delay refers to the delay of the connection determined for the slowest process corner of the target device. The slowest process corner refers the slowest clock speed, lowest supply voltage level, and highest temperature at which a target device can satisfy stated timing constraints. The fast corner delay refers to the delay of the connection determined for the fastest process corner of the target device. The fastest process corner refers the fastest clock speed, greatest supply voltage level, and lowest temperature at which a target device can satisfy stated timing constraints.

The "hold budget" used in computing $PSS_i$ is the hold budget of the path having the worst hold violation through connection i. For example, in FIG. 1, hold critical paths 124, 126, and 128 share connection 134. The process identifies the hold budget to be used in the computing the PSS for connection 134 as the hold budget of one of hold critical paths 124, 126, and 128 having the worst hold time violation (the greatest hold budget).

The ratio of slow corner delay/fast corner delay is used in computing $PSS_i$, because the path delays used to compute the hold budget are from a fast process corner, and the path delays used to compute the setup slack are from a slow process corner. The ratio of slow corner delay/fast corner delay can be established from data in speed files that describe the device to which the circuit design is targeted.

Figure 3:
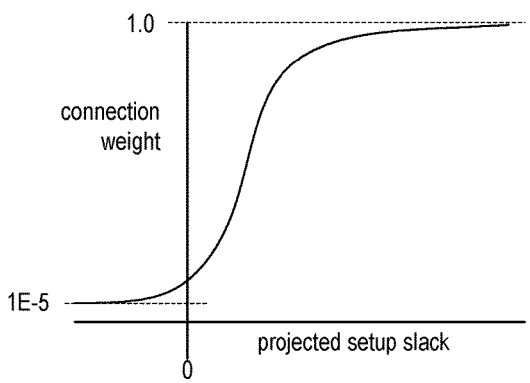
FIG. 3 shows a graph of an exemplary step-wise linear function.

At block 210, the projected setup slacks are weighted according to a step-wise linear function. The weight function translates a projected setup slack into a connection weight such that the connection weight exponentially decreases in value as the PSS decreases. FIG. 3 shows a graph of an exemplary step-wise linear function. The connection weight assigned to a connection reaches a maximum value of 1.0 when the projected setup slack is very high. When the projected setup slack is low, the connection weight decreases exponentially and reaches a minimum value of 1E−5. The connection weight is not made 0 when the projected setup slack is low in order to avoid preventing assignment of a connection hold budget in all situations in which the setup time would be degraded. If assignment of a connection hold budget is prevented in all situations in which the setup time would be degraded, fixing the hold time violation might be impossible.

Returning now to FIG. 2, the length of the shortest path through each connection is determined at block 212. The length of the shortest path through each connection can be determined by performing one forward traversal to compute the shortest weight path to a given point from a source and another backward traversal to compute the shortest weight path to any sink from a given point. Using these two values, the shortest weight path through a connection is computed.

At block 214, connection hold budgets are determined. Generally, the total hold budget is allocated amongst the connections on a path according to a ratio of the connection weights to the total of connection weights of connections on the shortest path. For each connection, the connection hold budget is a function of the total hold budget, the assigned connection weight, and the connection weights of the connections on the shortest path through the connection. The connection hold budget for connection i is:

connection hold budget$_i$=(total hold budget*$W_i$)/sum ($W_h, \ldots, W_j$)

The total hold budget is the total hold budget determined at block 206 for the shortest path through connection i. W is the connection weight assigned to connection i. The sum ($W_h, \ldots, W_j$) is summation of the weights assigned to the connections $W_h$ through $W_j$ on the shortest path through connection i.

Using the path from flip-flop 106 to flip-flop 112 in FIG. 1 as an example, it can be seen that connection 134 is on both the hold critical path 128 and on the setup critical paths 130 and 132. As connection 134 is on a setup critical path, the projected setup slack would be very small, because the setup slack through connection 134 would be negative. The connection weight computed from the very small projected setup slack would be 1E-5. Connection 142 is on hold critical path 128 but not on any other path, which means the setup slack on a path having connection 142 can be a very large value, and the projected setup slack will be a larger value. The large projected setup slack results in connection 142 having a connection weight of 1.0.

Using the connection weights determined for connections 134 and 142, the connection hold budget for connection 134 can be determined as:

connection hold budget$_{134}$=(total hold budget*1$E$-5)/(1+1$E$-5)

As the connection weight of connection 134 is 1E-5, the connection hold budget for connection 134 will be very small. The connection hold budget for connection 142 can be determined as:

connection hold budget$_{142}$=(total hold budget*1)/(1+1$E$-5)

As the connection weight of connection 132 is 1.0, most (or all) of the total hold budget can be allocated as the connection hold budget for connection 142. The computed connection hold budgets for connections 134 and 142 force the hold violation to be fixed on connection 142 and thereby avoid degrading the setup times on paths 130 and 132.

The connection hold budgets can be adjusted at block 216 to account for downstream connection hold budgets and thereby avoid unnecessary modifications to the circuit design. In some scenarios, the process of allocating the total hold budget can result in a connection hold budget that is greater than needed to fix the hold time violation. For example, referring to FIG. 1, hold critical path 126 might have a much larger hold violation than hold critical path 124. Thus, the total hold budget of hold critical path 126 would be much greater than the total hold budget of hold critical path 124. Because connection 134 is also on setup critical paths 130 and 132, the connection hold budget determined for connection 134 would be 1E-5. The connection hold budget determined for connection 140 would be ½ of the total hold budget of hold critical path 126, which is the worst hold critical path having connection 140. Connection 138 would be assigned the other ½ of the other half of the total hold budget of hold critical path 126.

After having determined the connection hold budget for connection 140 based on the worst hold critical path 126 through connection 140, the connection hold budget for connection 140 may be sufficient to remedy the hold violation of hold critical path 124 through connection 136. Arithmetically, if the connection hold budget$_{140}$>total hold budget$_{124}$, then connection 136 does not need a connection hold budget.

The disclosed approaches first assign connection hold budgets to the connections in the fan-in cone to a sink as described above in blocks 204-214. At block 216 the connection hold budgets are adjusted by traversing the netlist back from the sink to the connections and summing the connection hold budgets on the path in tracing back to a connection. The summed connection hold budgets between a connection and the sink can be referred to as the downstream hold budget at the connection. For example, referring to FIG. 1, the downstream hold budget at connection 136 is the sum of the connection hold budgets assigned to connections 134 and 140.

If the downstream connection hold budget at connection i is greater than or equal to the total hold budget of the hold critical path having connection i, then the connection hold budget for connection i can be reduced to 0. Otherwise, the connection hold budget can be assigned the lesser of the current value of the connection hold budget of connection i, or the difference between the total hold budget of the path having connection i and the downstream connection hold budget at connection i.

At block 218, once connection hold budgets have been established, hold time violations can be fixed in the circuit design by adding delays to the connections consistent with the connection hold budgets determined above. At block 220, the circuit design can be rerouted to include the added delay elements, and configuration data can be generated for implementing a circuit according to the circuit design. For example, the configuration data can implement a circuit on FPGA circuitry of a programmable IC. At block 222, a programmable IC can be configured with the generated configuration data to implement the circuit.

Figure 4:
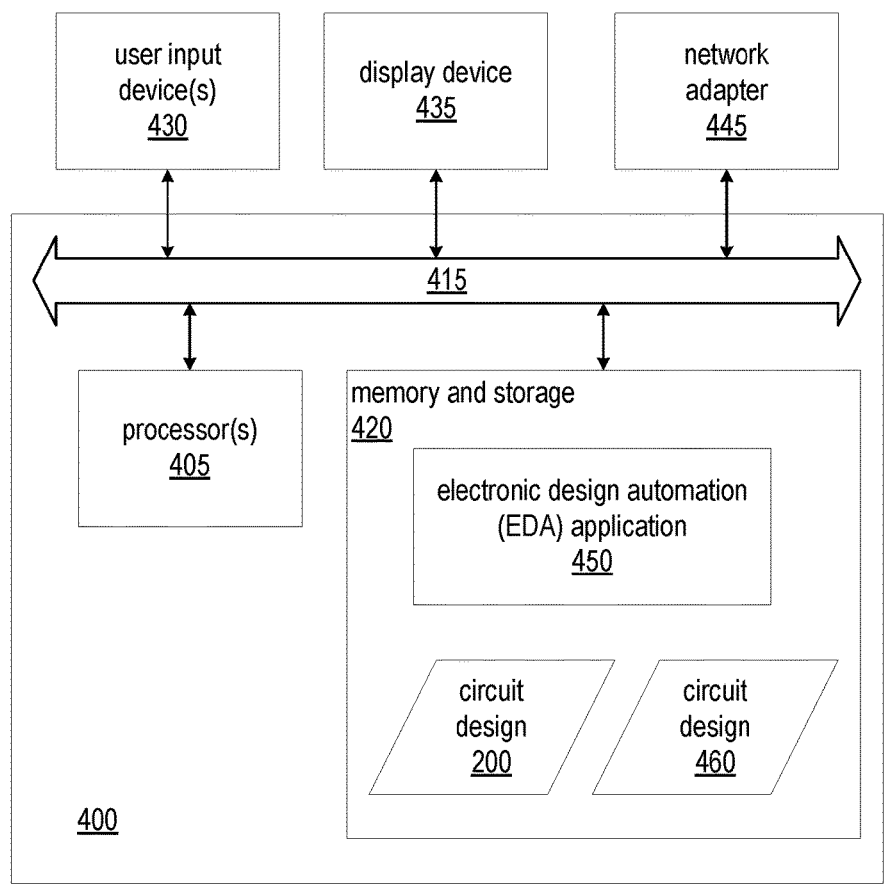
FIG. 4 is a block diagram illustrating an exemplary data processing system.

FIG. 4 is a block diagram illustrating an exemplary data processing system (system) 400. System 400 is an example of an EDA system. As pictured, system 400 includes at least one processor circuit (or "processor"), e.g., a central processing unit (CPU) 405 coupled to memory and storage arrangement 420 through a system bus 415 or other suitable circuitry. System 400 stores program code and circuit design 100 within memory and storage arrangement 420. Processor 405 executes the program code accessed from the memory and storage arrangement 420 via system bus 415. In one aspect, system 400 is implemented as a computer or other data processing system that is suitable for storing and/or executing program code. It should be appreciated, however, that system 400 can be implemented in the form of any system including a processor and memory that is capable of performing the functions described within this disclosure.

Memory and storage arrangement 420 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 400 may also include one or more cache memories (not shown) that provide temporary storage of at least some program code and data in order to reduce the number of times program code and data must be retrieved from local memory and persistent storage during execution.

Input/output (I/O) devices such as user input device(s) 430 and a display device 435 may be optionally coupled to system 400. The I/O devices may be coupled to system 400 either directly or through intervening I/O controllers. A network adapter 445 also can be coupled to system 400 in order to couple system 400 to other systems, computer systems, remote printers, and/or remote storage devices through intervening private or public networks. Modems, cable modems, Ethernet cards, and wireless transceivers are examples of different types of network adapter 445 that can be used with system 400.

Memory and storage arrangement 420 may store an EDA application 450. EDA application 450, being implemented in the form of executable program code, is executed by processor(s) 405. As such, EDA application 450 is considered part of system 400. System 400, while executing EDA application 450, receives and operates on circuit design 200. In one aspect, system 400 performs a design flow on circuit design 100, and the design flow may include synthesis, mapping, placement, routing, application of the disclosed approaches for fixing hold time violations in the circuit design 200 as described herein, and generating configuration data for a programmable IC. System 400 generates a modified, version of circuit design 200 as circuit design 460.

EDA application 450, circuit design 200, circuit design 460, and any data items used, generated, and/or operated upon by EDA application 450 are functional data structures that impart functionality when employed as part of system 400 or when such elements, including derivations and/or modifications thereof, are loaded into an IC such as a programmable IC causing implementation and/or configuration of a circuit design within the programmable IC.

FIG. 5 shows a programmable integrated circuit (IC) 500 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for fixing hold time violations in circuit designs. Other aspects and features will be apparent to those skilled in the art from consideration of the specification. It is intended that the specification and drawings be considered as examples only, with a true scope of the invention being indicated by the following claims.

What is claimed is:

1. A method of fixing a hold time violation in a circuit design, comprising:
   performing on a computing arrangement, operations including:
      determining a first hold budget that is an amount to fix a first hold time violation on a first path of the circuit design;
      determining for each connection of a first plurality of connections on the first path, a respective projected setup slack of the connection in allocating the first hold budget to fixing the first hold time violation on the connection, wherein the determining the respective projected setup slack includes determining the respective projected setup slack as a function of a setup slack of a path having the connection and the first hold budget;

determining for each connection of the first plurality of connections, a respective connection hold budget based on the first hold budget and the respective projected setup slack, wherein the determining the respective connection hold budget includes:

generating for each connection of the first plurality of connections a respective weight that decreases in value as the respective projected setup slack decreases, and assigning to each connection of the first plurality of connections a portion of the first hold budget indicated by the respective weight; and adding a delay to each connection of the first plurality of connections according to the respective connection hold budget.

2. The method of claim 1, wherein the respective projected setup slack describes allocation of all of the first hold budget to fixing the first hold time violation on the connection.

3. The method of claim 1, further comprising:
determining a second hold budget that is an amount to fix a second hold time violation on a second path of the circuit design;

determining for each connection of a second plurality of connections on the second path, a respective projected setup slack that describes a setup slack of the connection in allocating the second hold budget to fixing the second hold time violation on the connection;

determining for each connection of the second plurality of connections on the second path, a respective connection hold budget based on the second hold budget and the respective projected setup slack;

wherein the determining the respective connection hold budgets of the second plurality of connections includes adjusting a respective connection hold budget of the second plurality of connections based on at least one respective connection hold budget of at least one other connection that is on the first path and the second path; and adding a delay to each connection of the second plurality of connections on the second path according to the respective connection hold budget.

4. The method of claim 1, wherein the determining the respective projected setup slack includes determining the respective projected setup slack as a function of a setup slack of a path having the connection and the first hold budget.

5. The method of claim 4, wherein the determining the respective projected setup slack includes scaling the first hold budget by a ratio of a slow corner delay to a fast corner delay.

6. The method of claim 1, wherein
the weight exponentially decreases in value as the respective projected setup slack decreases.

7. The method of claim 1, wherein the first path is a shortest path from a source to a sink of the circuit design.

8. The method of claim 1, wherein the determining the respective projected setup slack of the connection includes:
identifying the first path as having a greatest hold violation of all paths containing the connection; and
determining the respective projected setup slack as a function of a setup slack of a path having the connection and the first hold budget.

9. The method of claim 8, wherein the setup slack is a slack of a path of the circuit design having a least setup slack value.

10. The method of claim 1, further comprising:
generating configuration data from the circuit design after adding the delay to each connection of the first plurality of connections; and
configuring a programmable IC with the configuration data.

11. A system comprising:
one or more processors; and
a memory arrangement coupled to the one or more processors, wherein the memory arrangement is configured with instructions for fixing a hold time violation in a circuit design, and the instructions when executed by the one or more processors cause the one or more processors to perform operations including:

determining a first hold budget that is an amount to fix a first hold time violation on a first path of the circuit design as a function of a setup slack of a path having the connection and the first hold budget;

determining for each connection of a first plurality of connections on the first path, a respective projected setup slack of the connection in allocating the first hold budget to fixing the first hold time violation on the connection;

determining for each connection of the first plurality of connections, a respective connection hold budget based on the first hold budget and the respective projected setup slack, including:

generating for each connection of the first plurality of connections a respective weight that decreases in value as the respective projected setup slack decreases, and assigning to each connection of the first plurality of connections a portion of the first hold budget indicated by the respective weight; and adding a delay to each connection of the first plurality of connections according to the respective connection hold budget.

12. The system of claim 11, wherein the respective projected setup slack describes allocation of all of the first hold budget to fixing the first hold time violation on the connection.

13. The system of claim 11, wherein the memory is further configured with instructions that when executed by the one or more processors cause the one or more processors to perform operations including:

determining a second hold budget that is an amount to fix a second hold time violation on a second path of the circuit design;

determining for each connection of a second plurality of connections on the second path, a respective projected setup slack that describes a setup slack of the connection in allocating the second hold budget to fixing the second hold time violation on the connection;

determining for each connection of the second plurality of connections on the second path, a respective connection hold budget based on the second hold budget and the respective projected setup slack;

wherein the determining the respective connection hold budgets of the second plurality of connections includes adjusting a respective connection hold budget of the second plurality of connections based on at least one respective connection hold budget of at least one other connection that is on the first path and the second path; and adding a delay to each connection of the second plurality of connections on the second path according to the respective connection hold budget.

14. The system of claim 11, wherein the instructions for determining the respective projected setup slack include instructions for determining the respective projected setup slack as a function of a setup slack of a path having the connection and the first hold budget.

15. The system of claim 14, wherein the instructions for determining the respective projected setup slack include instructions for scaling the first hold budget by a ratio of a slow corner delay to a fast corner delay.

16. The system of claim 11, wherein;
the weight exponentially decreases in value as the respective projected setup slack decreases.

17. The system of claim 11, wherein the first path is a shortest path from a source to a sink of the circuit design.

18. The system of claim 11, wherein the instructions for determining the respective projected setup slack of the connection includes instructions for:

identifying the first path as having a greatest hold violation of all paths containing the connection; and determining the respective projected setup slack as a function of a setup slack of a path having the connection and the first hold budget.

19. The system of claim 18, wherein the setup slack is a slack of a path of the circuit design having a least setup slack value.

20. The system of claim 11, the memory is further configured with instructions that when executed by the one or more processors cause the one or more processors to perform operations including:

generating configuration data from the circuit design after adding the delay to each connection of the first plurality of connections; and configuring a programmable IC with the configuration data.

* * * * *